US006934731B1

(12) United States Patent
Katznelson

(10) Patent No.: US 6,934,731 B1
(45) Date of Patent: Aug. 23, 2005

(54) RATIONAL FREQUENCY SYNTHESIZERS EMPLOYING DIGITAL COMMUTATORS

(75) Inventor: Ron D. Katznelson, Encinitas, CA (US)

(73) Assignee: Broadband Innovations, Inc., San Diego, CA (US)

( * ) Notice: Subject to any disclaimer, the term of this patent is extended or adjusted under 35 U.S.C. 154(b) by 0 days.

(21) Appl. No.: 09/579,847

(22) Filed: May 25, 2000

(51) Int. Cl.$^7$ ............................................... G06F 1/02
(52) U.S. Cl. ...................................................... 708/270
(58) Field of Search ................................ 708/270–271, 708/845; 327/105–106, 113, 117, 119

(56) References Cited

U.S. PATENT DOCUMENTS

| | | | |
|---|---|---|---|
| 3,955,143 | A | 5/1976 | Collins |
| 4,206,425 | A | 6/1980 | Nossen |
| 4,733,197 | A | 3/1988 | Chow |
| 4,801,896 | A | 1/1989 | Phillips |
| 4,871,981 | A | 10/1989 | Franklin |
| 5,059,924 | A | 10/1991 | JenningsCheck |
| 5,267,189 | A * | 11/1993 | Wilke ........................ 708/845 |
| 5,493,243 | A | 2/1996 | Ghoshal |
| 5,731,719 | A | 3/1998 | Wang et al. |
| 5,781,459 | A * | 7/1998 | Bienz ........................ 708/271 |
| 6,249,189 | B1 | 6/2001 | Wu |
| 6,525,615 | B1 * | 2/2003 | Masenas et al. ............ 327/159 |

* cited by examiner

*Primary Examiner*—Tan V. Mai
(74) *Attorney, Agent, or Firm*—Nath & Associates PLLC; Gary M. Nath; Marvin C. Berkowitz

(57) ABSTRACT

A method and an apparatus are disclosed for digital synthesis of signals having a frequency which is a rational factor n/m times an existing reference or clock frequency, wherein n and m may be large relatively prime integers. The invention provides for the use of a periodic sequence generator having up to N taps which are connected to a cascade of digital commutating multiplexers. The periodic sequence generator and the commutating multiplexers have periodicities $f_i$ that are determined by programmable address counters and the choice of N. The resultant signal at the output of the last commutator stage has a spectral frequency component at a desired frequency which is an algebraic sum of the frequencies $f_i$ (each taken with either positive or negative signs). One aspect of the invention provides for the use of weighted linear combination of commutator output lines, thereby further aiding in improving its spectral purity performance. The advantage of the embodiments according to the invention is that it incurs very little phase noise degradations, thereby providing for a signal source with phase noise performance essentially equal to that of the reference signal.

15 Claims, 6 Drawing Sheets

US 6,934,731 B1

RATIONAL FREQUENCY SYNTHESIZERS EMPLOYING DIGITAL COMMUTATORS

BACKGROUND OF THE INVENTION

It is often required to synthesize a signal source having a frequency which is a rational factor n/m times an existing reference or clock frequency. This need for synthesis may include cases where n and m are relatively prime large integers and typical implementation of such synthesizers involves the use of phase locked loops ("PLL") operating on prescaled (divided) frequency versions of the desired signal and the reference or clock signal. These PLL synthesizers typically use a comparison frequency that is m times smaller than the reference or clock signal and thus produce synthesized signals on the desired frequency but with phase noise limitations due to large frequency divisions associated with large values of m. In such applications, the phase noise power is proportional to the square of the division ratio.

It is the object of the instant invention to provide for a synthesizer that permits rational synthesis, i.e. synthesis of a signal source having a frequency which is a rational factor n/m times an existing reference or clock frequency, without incurring phase noise degradations thereby providing for a signal source with phase noise essentially equal to that of the reference signal.

SUMMARY OF THE INVENTION

Briefly stated, in accordance with embodiments of the present invention, a method for signal synthesis and a signal synthesizer are provided. A plurality of signals is generated, e.g. N signals, where N is an integer. The signals each have spectral energy at a frequency $f_1$. The signals are applied to an N-way commutator that has M commutator sliders, where M is at least 2 and not greater than N. The commutator slides are rotated across the N inputs of the N-way commutator at a frequency $f_1$. At each of the M commutator sliders outputs signs are provided having spectral energy at a frequency $f_0$, where frequency $f_0 = f_1 \pm f_2$. In further forms, particular values of N and M may be selected to provide particular benefits. A weighting function may be used to improve the purity of $f_0$. The signal synthesizer may also be utilized to provide a phase locked loop signal synthesizer or an injection locked oscillator. A new phase locked loop is also provided. This Summary is illustrative and not exhaustive, and is not intended to limit the scope of the present invention.

DETAILED DESCRIPTION OF THE PREFERRED EMBODIMENT

Figure 1:
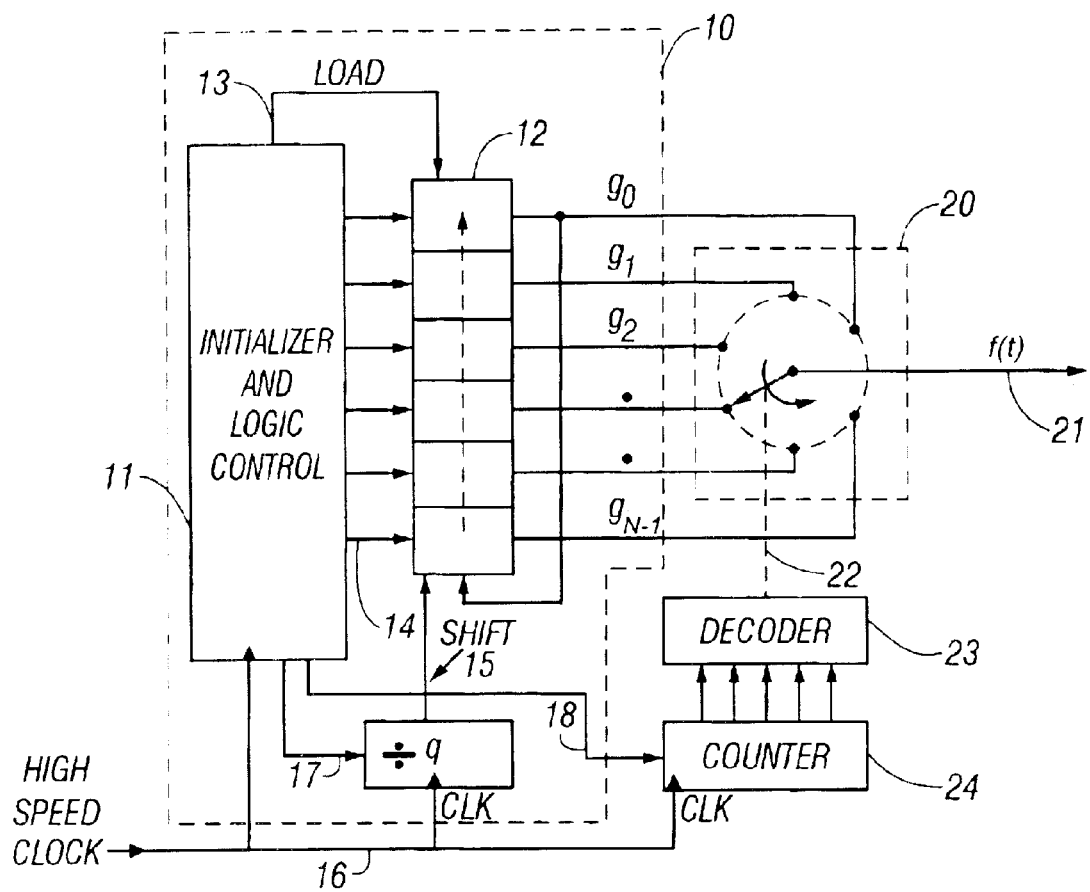
FIG. 1 illustrates a periodic pattern binary signal generator feeding a commutator in accordance with the present invention.
Figure 2:
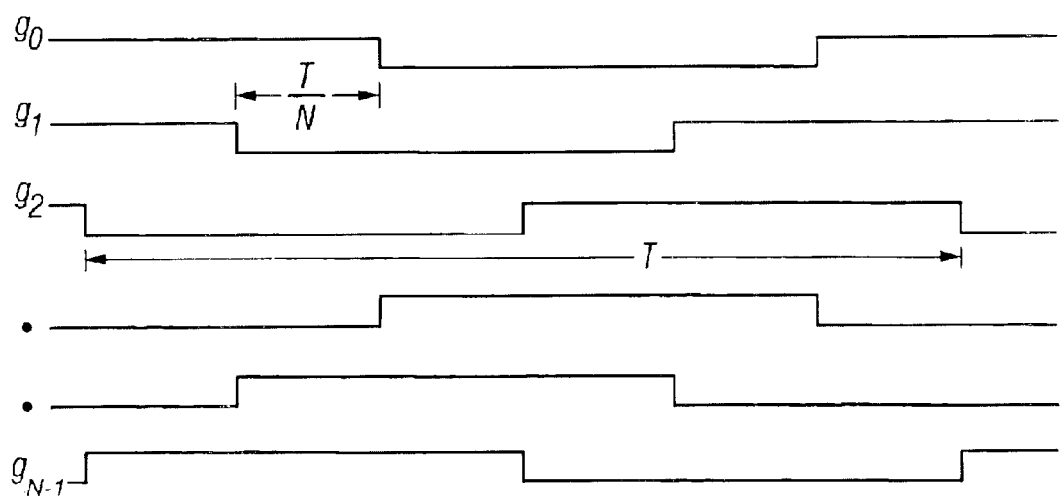
FIG. 2 shows an example of the periodic binary signals generated by the periodic pattern binary signal generator of FIG. 1.
Figure 3:
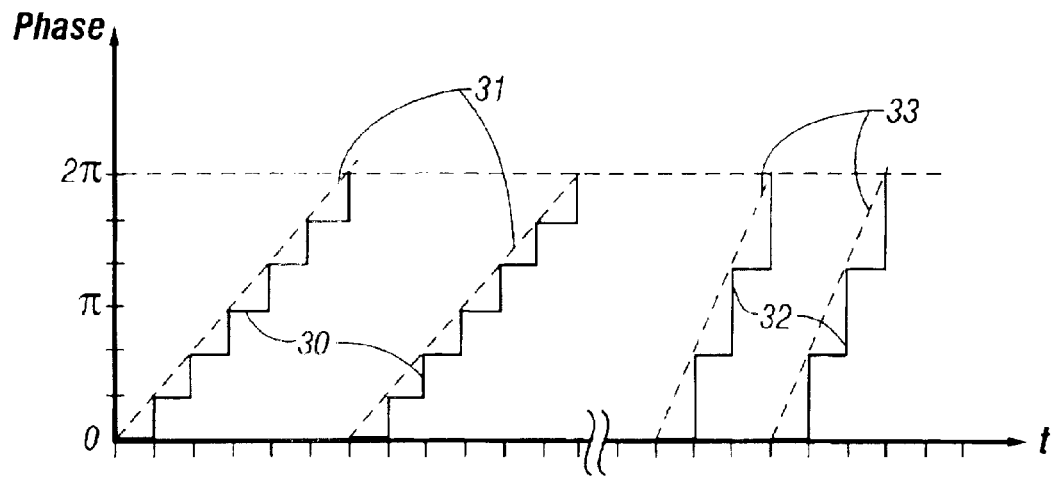
FIG. 3 depicts the phase trajectory of the output signal f(t) as seen on the slider of the commutator of FIG. 1.

FIG. 1 shows the first element of the preferred embodiment. A Periodic Pattern Generator 10 provides a plurality of periodic signals $g_0$, $g_1$ through $g_{N-1}$ where N is the number of output signals from the Periodic Pattern Generator. In the embodiment of FIG. 1, a circulating shift register 12 is used to generate these signals. A "shift" signal on line 15 appears at a rate q times lower than the clock (reference) signal on line 16. Initializing the content of Shift Register 12 is accomplished by means of the Initializer Logic Control unit 11 by loading a digital bit pattern through parallel lines 14 upon the "Load" command on line 13. An alternative Periodic Pattern Generator may be constructed using other means known in the art such as counters and decoders or periodic state machines having multiple taps. In an exemplary embodiment of the present invention using shift register 12, a square wave pattern is initially loaded (in this case three consecutive "1's" and three consecutive "0's") although, as will be subsequently discussed, other patterns may be advantageous for certain spectral purity requirements. For the square waveform circulating in shift register 12, the resulting waveforms of the periodic signals $g_0$, $g_1$ through $g_{N-1}$ are shown in FIG. 2. As can be seen, these are phase shifted versions of a square wave having a period of N*q times that of the reference clock signal. We refer to the frequency associated with this period as the 'shift register frequency' or the 'periodic state machine frequency' which in this case is $f_c/(Nq)$, where $f_c$ is the reference clock frequency. The periodic signals $g_0$, $g_1$ through $g_{N-1}$ are fed to a Phase Commutator 20, which is an N way digital multiplexer that is controlled by MUX control lines 22 and provides an output digital signal f(t) on line 21. The periodic operation of the Phase Commutator 20 is governed by the decoded state of counter 24. Upon each clock cycle, decoder 23 decodes a different state of counter 24 and thus controls the commutator's slider to select a different signal $g_j$ to be connected to the output line 21. If every signal line from $g_0$, $g_1$ through $g_{N-1}$ is selected sequentially in order, the period of the Phase Commutator 20 can be as low as N times that of the reference. If one includes in the drive of counter 24 an internal pre-divider of the reference clock by an integers, than the Commutator 20 frequency is N*p times lower than that of the reference c lock signal. We call this frequency the 'commutator frequency' which is given by $f_c/(Nq)$. Because the periodic signal's phase available to the slider of the Commutator 20 is advancing through the sequential selection of signals $g_0$, $g_1$ through $g_{N-1}$ one can regard the Phase Commutator's action as providing at its output a signal f(t) with a phase which is a discrete-time step approximation to a continuous linear phase shift with time. This is shown in FIG. 3 for a case in which N=6. In reference to FIG. 3, the phase trajectory of the signal f(t) is depicted as a step trajectory 30, having six equal phase steps per cycle of the Phase Commutator. It can be seen that it is a discrete time approximation to the linear phase trajectory 31 shown as a straight broken line.

Those skilled in the art of signal parameters would now appreciate that a signal undergoing a linear phase shift with time is simply a signal whose original frequency is translated or changed. The amount of frequency shift is simply given by the slope of the phase trajectory and is equal to the inverse of the time period over which a total phase shift of $2\pi$ takes place. In the example of FIG. 3, this frequency shift is equal to the commutator's rotation frequency, which is one sixths of the clock frequency. It can be appreciated that in the above example, the phase shift steps are positive, meaning that the frequency shift is positive, resulting with a higher signal frequency. By reversing the Phase Commutator 20's slider rotation direction to the opposite direction (clockwise), the phase trajectory as in FIG. 3 assumes a negative slope, corresponding to a negative frequency shift. An equivalent frequency decrement effect can be achieved by keeping the Phase Commutator 20 operating in its original direction but reversing the bit shift direction for shift register 12. In either case, the relative direction of phase shift determines whether the frequency shift (or frequency conversion) is upwards or downwards. This frequency conversion effect is equivalent to frequency mixing known in the art, and as such, the upward conversion and downward conversion is equivalent to Single Side Band (SSB) mixing with resultant Upper Side Band (TSB) and Lower Side Band (LSB) mixing components respectively.

In another mode of the preferred embodiment of the instant invention, the slider of Phase Commutator 20 may be advanced by k signal lines per each clock cycle rather than one, thereby providing the output sequence $g_0, g_k, g_{2k}, g_{3k}$ where the subscript index is valued modulo N. This is shown for example in FIG. 3 by phase trajectory 32, which now approximates a continuous linear phase shift trajectory 33. As can be seen in this example the resultant phase slope is doubled, meaning that the conversion frequency shift is twice that related to trajectory 30. In this case there are only three phase sampling points per cycle, which degrades the quality of the approximation of a linear phase shift trajectory. However, as long as there are more than two phase samples per cycle (Nyquist Sampling Criterion), a significant energy at the intended shifted frequency will be present within the output signal f(t). However the spectral purity will be poorer than that which results from a Phase Commutator having a larger number (N) of phase shifted signal lines.

Figure 4:
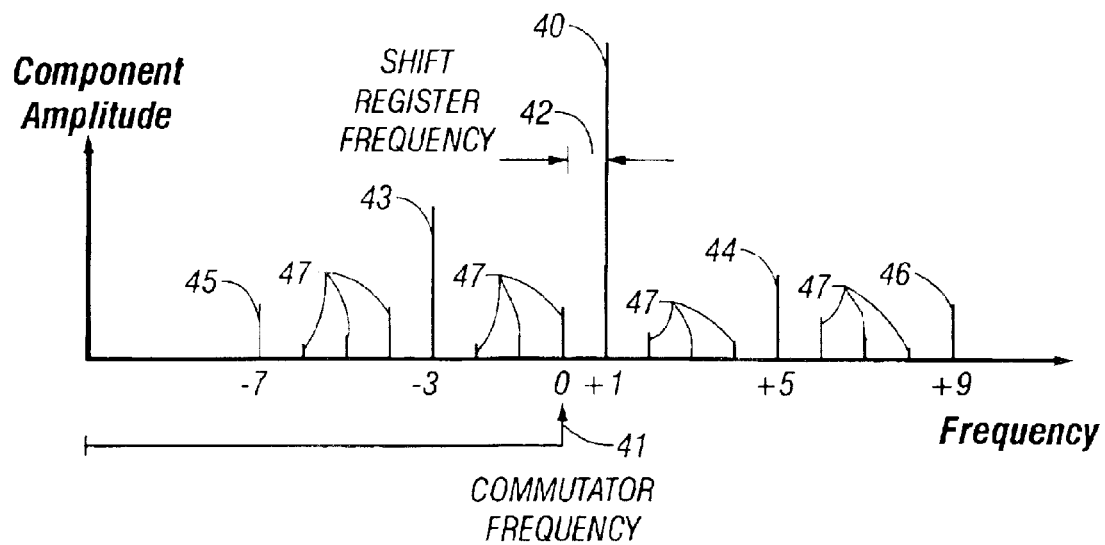
FIG. 4 illustrates schematically the Fourier spectrum of the output signal f(t) in FIG. 1.

A qualitative depiction of the amplitude spectrum of the output signal f(t) as a function of frequency is shown in FIG. 4. The intended frequency of the output signal is shown to posses a spectral component 40, having a dominant energy component in comparison to all other components. The commutator frequency 40 is shown on a frequency scale that is centered about it for discussion purposes. The frequency scale uses integral units of the shift register frequency 42. The spectral components 43, 44, 45 and 46 are due to the odd harmonic content of the square wave nature of the signals $g_j$ provided by the Periodic Pattern Generator 10, and are related respectively to the $3^{rd}$, $5^{th}$ and $7^{th}$ harmonics of the square wave provided by the Periodic Pattern Generator 10. Note that other lower level spectral components 47 may be present. It can be shown mathematically that the relative levels of spectral components 47 are related to the resolution of phase increments (to the value of N) and to the relative congruence of the commutator frequency and the shift register frequency. For commutator frequencies sufficiently high compared to that of the shift register cycle, components 47 can be made progressively small with the increasing values of N. This is due to the fact that as N increases (keeping the commutator and shift register frequencies constant), the phase trajectories 30 of FIG. 3 asymptotically approach the continuous linear phase trajectory 31. Of course, higher values of N would require faster clock frequencies for obtaining the same frequency at the output of the Phase Commutator. Moreover, it will be appreciated that the increase in N would also necessitate higher complexity in implementing the Periodic Pattern Generator 10 and the Phase Commutator 20.

Turning back to the resultant frequency of the output signal, based on the foregoing discussion, it should be understood that the dominant desired frequency component due to the frequency conversion is shifted by an amount equal to $f_c ks/(Nq)$ with a sign dependent on the rotation direction of the commutator and where we designate the rotation direction by the sideband values assuming values of +1 or -1. By cascading several commutators of order N driven for different rotation rates, one can obtain a signal with resultant frequency $R_o$ given by $$R_0 = \frac{f_C}{N}\left(\frac{k_1 s_1}{q_1} + \frac{k_2 s_2}{q_2} + ...\right) \tag{1}$$

where numeric subscripts indicate the commutator cell index. This sum expression is due to the cascaded mixing nature of the commutators. Thus, signals whose frequencies constitute a rich set of possible rational values for $R_o/f_c$ can be generated with these structures—imparting the term Rational Synthesizer to the embodiments as described.

For a synthesizer of the present invention employing low complexity commutators (low values of N), the only practical value of k may be 1. Thus, given a desirable synthesis ratio $R_0/f_c$, the problem at hand is to find values of $q_1, q_2, \ldots$, so that $NR_0/f_c = 1/q_1 \pm 1/q_2 \pm \ldots$ holds. In other words, one needs to represent the desirable synthesis ratio (assumed to be a rational number) as a sum of unit fractions. In order to minimize complexity, it is desirable to find such unit fraction representations with a minimum number of terms and preferably with the smallest Possible values for the denominators $q_1, q_2, \ldots$ The number theory literature provides several algorithms for arriving at such representations with a substantial number of works on the 'Egyptian Fractions' case, for which all fractions are positive. A short survey of such mathematical works is given in section D11 (starting at page 158) of Richard K. Guy's book entitled "Unsolved Problems in Number Theora" Second Edition (1994), published by Springer-Verlag. It should be appreciated that allowing for both negative and positive unit fractions in the representation of the synthesis ratio minimizes the mathematical constraints, which can result in shorter sums with smaller denominators. In this general case, those skilled in the mathematical art of number theory would appreciate that it is useful to employ the simple property of the continued fraction representation of a rational number R given by:

$$R = a_0 + \cfrac{1}{a_1 + \cfrac{1}{a_2 + \cfrac{1}{a_3 + \cfrac{1}{a_4 + \cfrac{1}{a_5 + ...}}}}}$$

wherein $a_i$ are integers. Because R is rational, the continued fraction is finite. The convergents of R are formed by truncating the sequence and their values are alternately above and below R, and are successively better rational approximations to R. Successive convergents have differences that are unit fractions with increasing denominators. The sequence of these differences gives a desired unit fraction representation of R with alternating signs. Often, several consecutive terms in this sequence can be combined to form a single unit fraction with a smaller denominator, yielding a shorter sequence. For practical values of R it is possible to find a unit fraction representation with only three terms. This property was suggested by Schinzel's modification of Erdös' conjecture on unit fractions as described in an article by W. Sierpinski. "Sur les decompositions de nombres rationals en fractions primaires" Mathesis. 65: pp 16–32, (1956). Hence, theoretically, it should be possible to implement the Rational Synthesizer of the current invention with a cascade of only two commutator cells.

Figure 5:
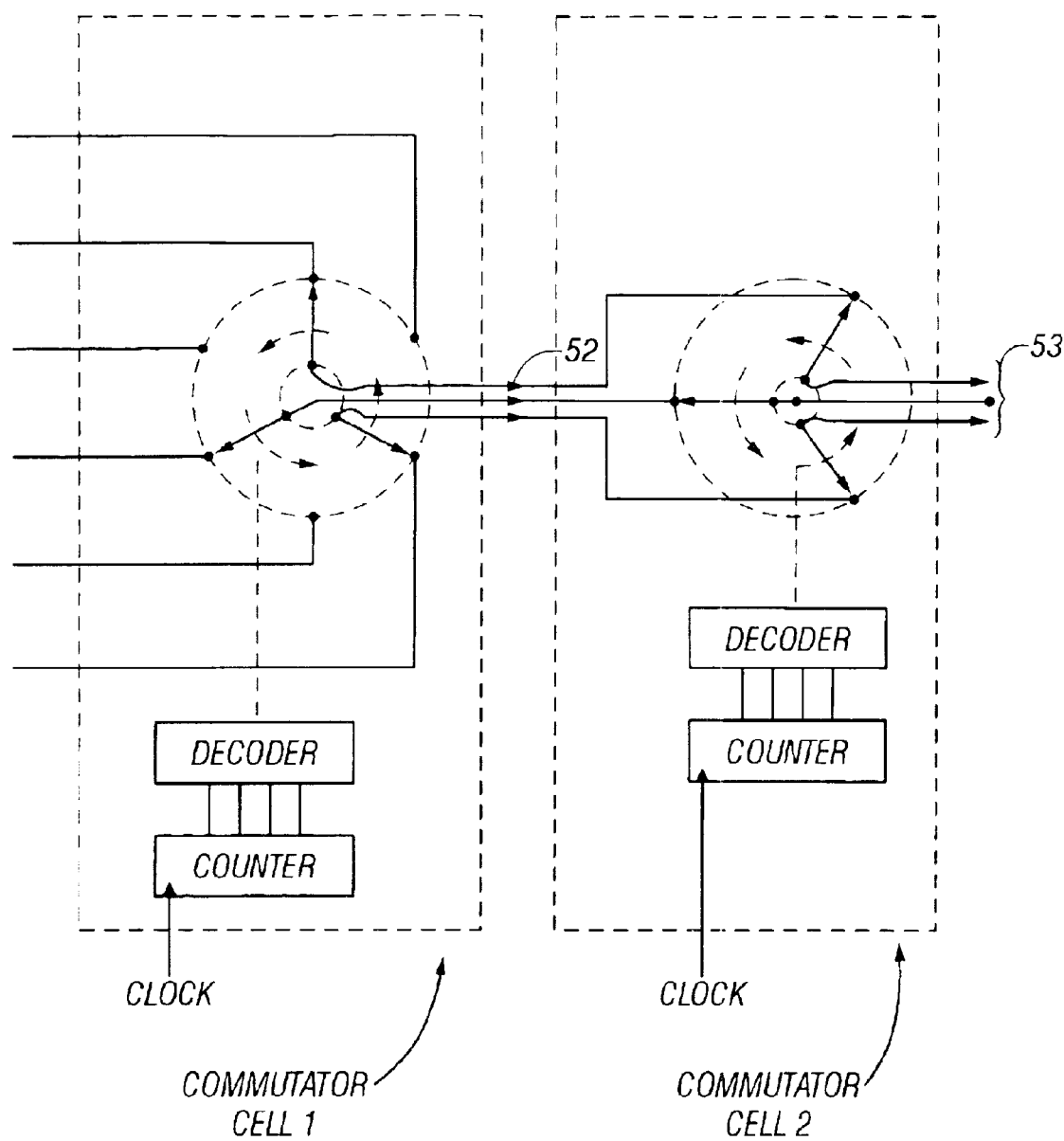
FIG. 5 shows an example of two cascaded commutator cells in accordance with the present invention.
Figure 6:
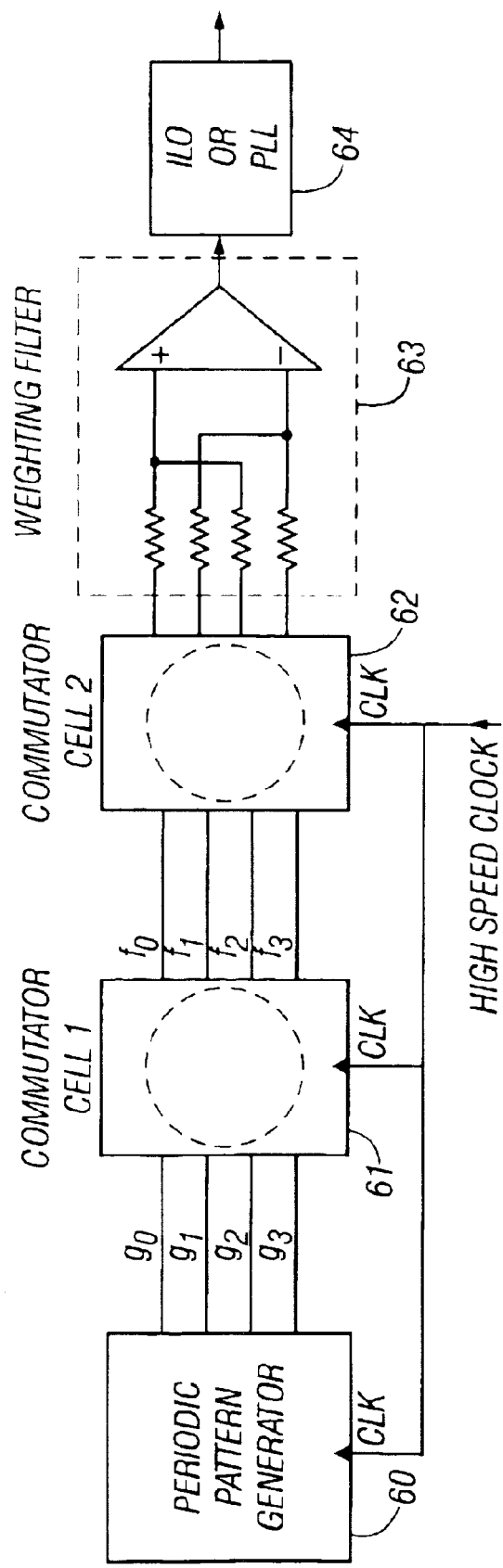
FIG. 6 illustrates two cascaded commutator cells followed by a weighting filter in accordance with the present invention.

The Phase Commutator shown in FIG. 1 has only one output. In order to provide for cascading of commutators and in order to obtain best spectral purity results, it would be advantageous to have a commutator with multiple sliders that commutate sequentially over the input signals $g_0$, $g_1$ through $g_{N-1}$ and consequently provide a sequence of output signals $f_0$, $f_1$ through $f_{N-1}$ all having similar spectral characteristics but with different phases. In that way, cascading that well preserves the phase sampling integrity can be made possible. An example of a rational synthesizer in accordance with the present invention that uses cascaded commutators is shown in FIG. 5. In this example, Commutator Cell 2 has three inputs (N=3) on lines 52 and three outputs on lines 53. It is cascading Commutator Cell 1, which is a subsampled N=6 commutator running on its own independent counter. In FIG. 6, a cascade of two independent four way commutators (N=4) is shown. The first commutator cell 61 is fed by the 4 phase periodic generator 60. The output signals of the first cell feeds the second commutator cell 62. It is understood that each commutator cell has within it the specific counters and decoders required for the appropriate frequencies. The four phase outputs of the second commutator cell 62 is feeding the weighting filter 63 which can be used to further filter out certain undesirable spectral components. The filter's operation is similar to a Finite Impulse Response (FIR) filter as it enables the use of various weighting coefficients for each of the output phases, permitting the construction of an output signal that is a linear combination of all output signals. These coefficients are determined by the values of the input resistors to the differential amplifier of the weighting filter. If further spectral purification of undesired sidebands is required it can be achieved by feeding the output signal of weighting filter 63 to an Injection Locked Oscillator (ILO) or Phase Locked Loop (PLL) shown as item 64. That way, the output signal on line 65 can be free of spurious components.

Figure 7:
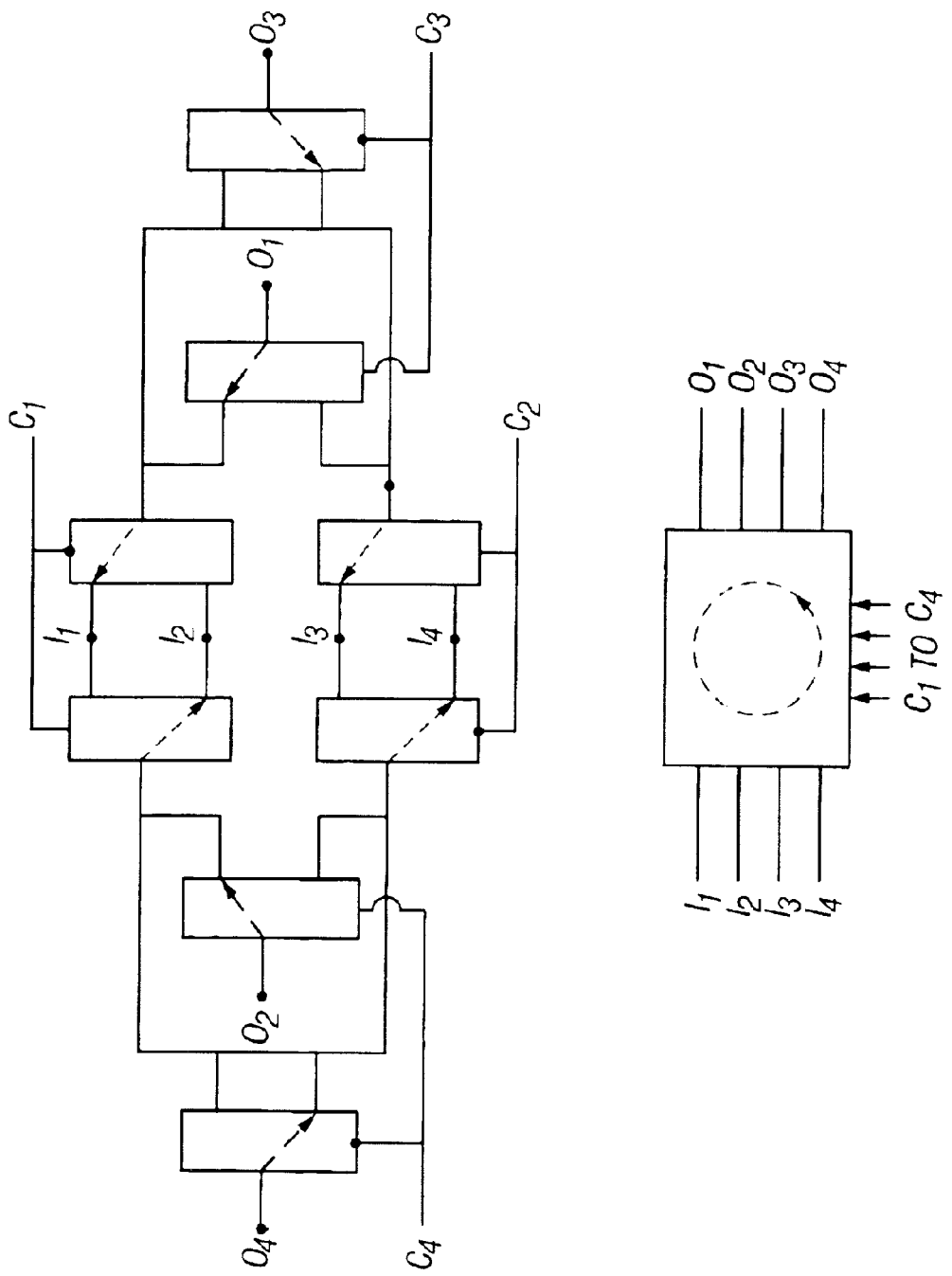
FIG. 7 details the implementation of a 4-way commutator as used in the present invention.

There is considerable advantage in using four way commutators since they provide a good compromise of phase sampling resolution and implementation complexity while maintaining appreciable frequency of operation. This is because of very efficient designs available for four way digital multiplexers. Detailed description of embodiments and applications using the four way commutator-based rational synthesizers of the present invention are provided in a copending application entitled "Rational Frequency Synthesizers" filed on May 25, 2000 for the benefit of a common assignee, which is incorporated herein by this reference in its entirety. According to the present invention, an example of a full four-way commutator with four inputs 11, 12, 13 and 14 and having four outputs $O_1$, $O_2$, $O_3$ and $O_4$, is shown in FIG. 7. The decoder (not shown) commands the operation of the commutator via control lines C1 through C4 in order to effect the proper sequential routing of the commutator. The four sequential states that are cycled through by proper control line values of 1 or 0 for C1 through C4 are shown in the following table, wherein the sense of control lines C1 through C4 is such that their logical values are all 0 at their state shown in FIG. 7.

| State | C1 = C2 | C3 | C4 | $O_1$ Output connected to: | $O_2$ Output connected to: | $O_3$ Output connected to: | $O_4$ Output connected to: |
|---|---|---|---|---|---|---|---|
| 0 | 0 | 0 | 0 | $I_1$ | $I_2$ | $I_3$ | $I_4$ |
| 1 | 1 | 0 | 1 | $I_2$ | $I_3$ | $I_4$ | $I_1$ |
| 2 | 0 | 1 | 1 | $I_3$ | $I_4$ | $I_1$ | $I_2$ |
| 3 | 1 | 1 | 0 | $I_4$ | $I_1$ | $I_2$ | $I_3$ |

In reference to FIG. 1, it is evident that a full cycle of the state machine is completed every qN clock pulses over a duration which is the fundamental period. During that period, the commutator completes g revolutions, giving rise to a dimensionless commutator frequency g. The single cell structure of FIG. 1 having instead N commutator sliders, each with a corresponding output signal, can be more generally analyzed mathematically by using the isomorphism between the field of binary values 1 and 0 and the binary number field of +1 and −1. Thus, without loss of generality, all binary signals assume values of +1 or −1.

Generally, for an N way rational synthesizer commutator we designate the $m^{th}$ output signal from a commutator as a function of time by $f_m(t)$ and we note that it is periodic and thus can be represented by its Fourier spectral components which we designate as $F_m(n)$. Here, n is the harmonic index of the frequency which is n times the frequency of the fundamental period. The input signals to the commutator as functions of time are designated as $g_0(t)$, $g_1(t)$ through $g_{N-1}$. If these signals have more generally, not one cycle within the N stage shift register, but r complete cycles, it can be shown that the Fourier spectrum of the output signals is given by $$F_m(n) = \frac{rNq}{2\pi(r+sq)} \exp[2\pi i smn/(qN)] \sum_{l=-\infty}^{l=\infty} \left[ \frac{G(l)\exp[-2\pi i smrl/(qN)]}{rl-n} \right] H(l) \quad (2)$$

where H(l) is an indicator function of l given by $$H(l) = \begin{cases} 1 & \text{whenever } l(sr+q) - sn = qNu; \text{ where } u \text{ is an integer} \\ 0 & \text{otherwise} \end{cases} \quad (3)$$

and where G(l) is the Fourier coefficient at frequency l of the periodic signal $g_0(t)$. By inspecting Equation (3) one notes that nonzero Fourier coefficients will only be at (positive or negative) frequencies n for which the linear Diaphontine equation in integers l and u at the top part of the definition of H(l), has solutions. Using basic number theoretic tools one finds that for a square wave form of $g_0(t)$ (having only odd order harmonics l) the offset frequencies n for which there is nonzero power is given by $$n = \mu d + sq + r; \text{ where d is the greatest common divisor of } 2(sr+q) \text{ and } qN \quad (4)$$

Here $\mu$ is any Positive or negative integer used to designate the non-zero spectral component. It is therefore possible to choose the parameters that, on the one hand, the desired frequency is generated and on the other hand, such that d is maximized, providing maximum spectral purity clearance about the desired frequency sq+r.

Figure 8:
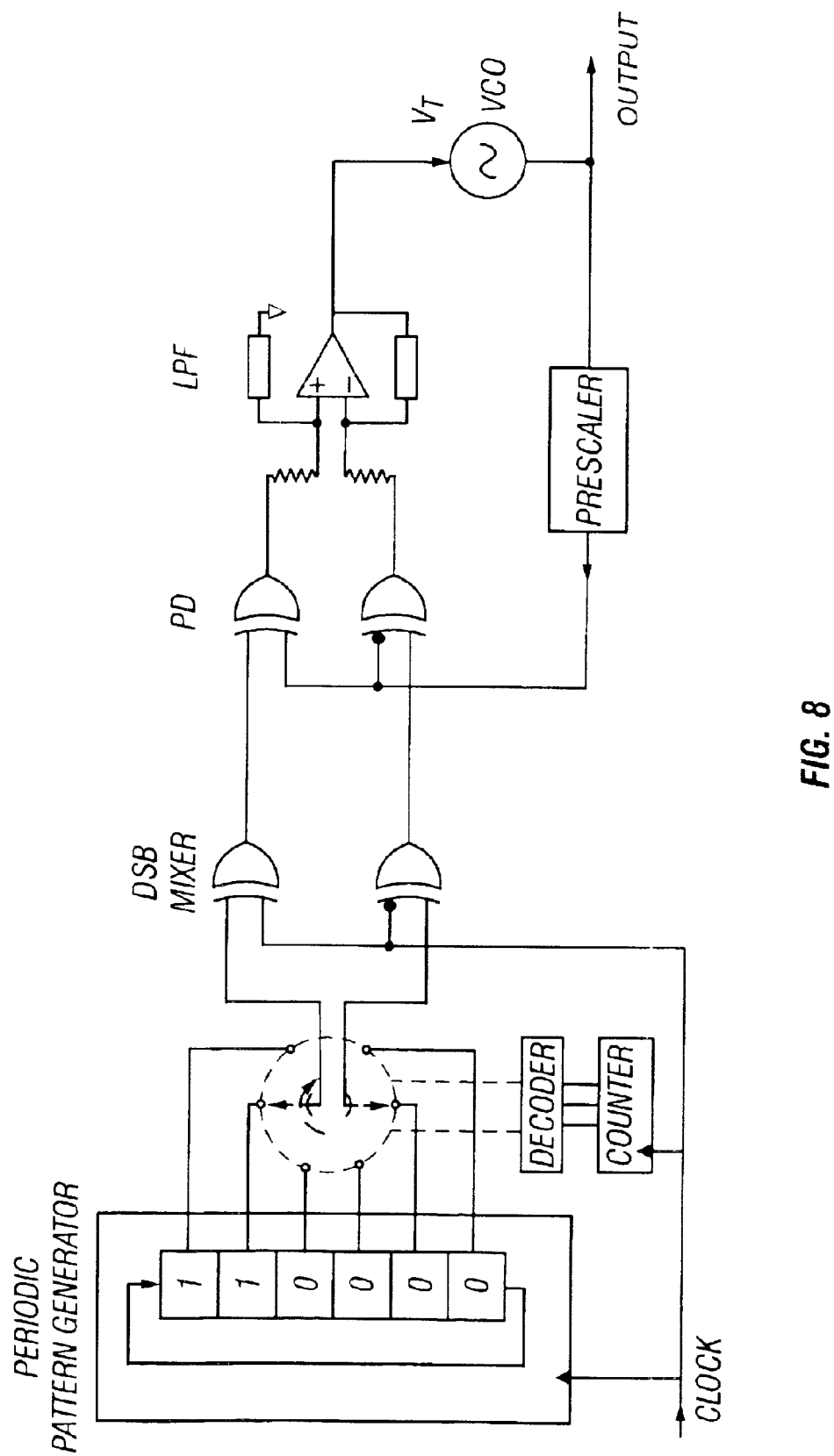
FIG. 8 shows a phase locked loop using a ternary reference signal produced by a commutator cell according to the present invention.

The expressions for the spectral components in Equations 2–4 above are for periodic pattern generators that cycle through a square wave which contains all odd harmonics. These components and their frequency aliases mix with the commutator frequencies and in some instances can produce undesirable sideband components near the desirable frequency. It is possible to construct a signal pattern that is free from all harmonics up to $5^{th}$ order by the periodic pattern generator shown in FIG. 8, which shows an embodiment of the rational synthesizer with a PLL using six way commutator with a non-square wave pattern, resulting in ternary level representation over the two slider output signals designed specifically to offer better spectral purity. It also incorporates a differential DSB mixer for applications requiring high frequency mixing and further incorporates a differential phase detector (PD) which permits the propagation of the symmetry and the ternary value into the differential low pass filter 86. In this case, VCO 88 is locked on a frequency that is an integral multiple of the desired frequency of the Rational Synthesizer at outputs 82 and 83.

What is claimed is:

1. A method for signal synthesis comprising the steps of
   providing periodic signals each having substantial spectral energy at a frequency $f_1$;
   feeding each of said N periodic signals to respectively each of N inputs of an N-way commutator having M commutating sliders, wherein M is at least 2 but no greater than N; and
   rotating the M commutator sliders across the N inputs of the N-way commutator at a frequency $f_2$, thereby obtaining at each of the M commutator sliders an output signal having substantial spectral energy at an output frequency $f_0$ wherein $f_0=f_2+f_1$ or $f_0=f_2-f_1$.

2. A method for signal synthesis comprising the steps of claim 1 and further comprising the steps of
   feeding each of the output signals obtained at each of said M commutator sliders to respectively each of M inputs of an M-way commutator having L commutating sliders, wherein L is less than or equal to M; and
   rotating the L commutator sliders of said M-way commutator across the M inputs of said M-way commutator at a frequency $f_3$, thereby obtaining at each of the L commutator sliders an output signal having substantial spectral energy at an output frequency $f_4$ wherein $f_4=f_3+f_0$ or $f_4=f_3-f_0$.

3. A signal synthesizer comprising
   a generator for generating N periodic signals each having substantial spectral energy at a frequency $f_1$;
   an N-way commutator having N inputs and M commutating sliders, wherein M is at least 2 but no greater than N and wherein each of said N periodic signals are respectively coupled to each of the N inputs of said N-way commutator;
   an arrangement for rotating the M commutator sliders of said N-way commutator across the N inputs of said N-way commutator at a frequency $f_2$, thereby obtaining at each of the M commutator sliders an output signal having substantial spectral energy at an output frequency $f_0$ wherein $f_0=f_2+f_1$ or $f_0=f_2-f_1$.

4. A signal synthesizer comprising a first synthesizer in accordance with claim 3 and further comprising
   an M-way commutator having L commutating sliders, wherein L is less than or equal to M and wherein each of said M sliders of said first synthesizer are respectively coupled to each of the M inputs of said M-way commutator;
   an arrangement for rotating the L commutator sliders of said M-way commutator across the M inputs of said M-way commutator at a frequency $f_3$, thereby obtaining at each of the L commutator sliders an output signal having substantial spectral energy at an output frequency $f_4$ wherein $f_4=f_3+f_0$ or $f_4=f_3-f_0$.

5. A signal synthesizer in accordance with claim 4 wherein M=4.

6. A signal synthesizer in accordance with claim 5 wherein N=4.

7. A signal synthesizer in accordance with claim 4 wherein L is at least 2 further comprising
   a weighting filter producing a filtered output signal and having inputs that are coupled to at least two of the L commutator sliders; and
   wherein the input weighting values of said weighting filter are set so that the filtered output signal has an improved spectral purity about the output frequency $f_4$.

8. A phased lock loop signal synthesizer having a reference signal input coupled to the filtered output signal of the synthesizer of claim 7.

9. An injection locked oscillator (ILO) having an injection reference signal input coupled to the filtered output signal of the synthesizer of claims 7.

10. A phase lock loop having a differential input feedback loop filter, said phase lock loop further comprised of
    a ternary level phase detector having one oscillator input line, two reference input lines and two output lines coupled to the differential input feedback loop filer; and
    a ternary level reference signal generator comprised of a signal synthesizer in accordance with claim 4 wherein L=2 and wherein the L commutator sliders produce output signals representative of a ternary signal; and
    wherein said L commutator sliders are coupled to the two reference input lines of said ternary level phase detector.

11. A signal synthesizer in accordance with claim 3 wherein N=4.

12. A signal synthesizer in accordance with claim 3 further comprising
    a weighting filter producing a filtered output signal and having inputs that are coupled to at least two of the M commutator sliders; and
    wherein the input weighting values of said weighting filter are set so that the filtered output signal has an improved spectral purity about the output frequency $f_0$.

13. A phased lock loop signal synthesizer having a reference signal input coupled to the filtered output signal of the synthesizer of claim 12.

14. An injection locked oscillator (ILO) having an injection reference signal input coupled to the filtered output signal of the synthesizer of claim 12.

15. A phase lock loop having a differential input feedback loop filter, said phase lock loop further comprised of a ternary level phase detector having one oscillator input line, two reference input lines and two output lines coupled to the differential input feedback loop filter; and
    a ternary level reference signal generator comprised of a signal synthesizer in accordance with claim 3 wherein M=2 and wherein the two commutator sliders produce output signals representative of a ternary signal; and
    wherein said two commutator sliders are coupled to the two reference input lines of said ternary level phase detector.

* * * * *

UNITED STATES PATENT AND TRADEMARK OFFICE
CERTIFICATE OF CORRECTION

PATENT NO.   : 6,934,731 B1
DATED        : August 23, 2005
INVENTOR(S)  : Katznelson It is certified that error appears in the above-identified patent and that said Letters Patent is hereby corrected as shown below:

Column 7,
Line 19, please delete "providing periodic" and replace with -- providing N periodic --.

Column 8,
Line 4, please delete "$f_4=f_3\ f_0$" and replace with -- $f_4=f_3-f_0$ --.
Line 22, please delete "claims 7" and replace with -- claim 7 --.
Line 28, please delete "filer" and replace with -- filter --.

Signed and Sealed this

Eleventh Day of October, 2005

JON W. DUDAS
*Director of the United States Patent and Trademark Office*